United States Patent
Lee et al.

(10) Patent No.: US 9,368,746 B2
(45) Date of Patent: Jun. 14, 2016

(54) GAS BARRIER THIN FILM, ELECTRONIC DEVICE COMPRISING THE SAME, AND METHOD OF PREPARING THE GAS BARRIER THIN FILM

(75) Inventors: Kwang-hee Lee, Yongin-si (KR); Jong-jin Park, Yongin-si (KR); Xavier Bulliard, Yongin-si (KR); Yun-hyuk Choi, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 701 days.

(21) Appl. No.: 12/505,245

(22) Filed: Jul. 17, 2009

(65) Prior Publication Data

US 2010/0159255 A1 Jun. 24, 2010

(30) Foreign Application Priority Data

Dec. 19, 2008 (KR) .......... 10-2008-0130441

(51) Int. Cl.
*C09D 183/08* (2006.01)
*H01L 31/048* (2014.01)
(Continued)

(52) U.S. Cl.
CPC .......... *H01L 51/5237* (2013.01); *C09D 183/04* (2013.01); *C09D 183/16* (2013.01);
(Continued)

(58) Field of Classification Search
None
See application file for complete search history.

(56) References Cited

U.S. PATENT DOCUMENTS 2,676,163 A * 4/1954 Speier .................. C08G 77/54
525/477
5,302,682 A * 4/1994 Shirahata .................. 528/14

(Continued)

FOREIGN PATENT DOCUMENTS

JP 07-291744 A 11/1995
JP 08-236274 A 9/1996
(Continued)

OTHER PUBLICATIONS

"TB1: KiON Ceraset® Polyureasilazane and KiON® Ceraset® Polysilazane 20, Heat-Curable Resins", from KiON Corporation, www.kioncorp.com, last modified Jun. 23, 2008.*
(Continued)

*Primary Examiner* — Kenneth Stachel
(74) *Attorney, Agent, or Firm* — Cantor Colburn LLP (57) ABSTRACT

A gas barrier thin film having a substrate, an anchoring layer, and an inorganic oxide layer, the anchoring layer including a silicon-containing organic-inorganic composite copolymer comprising a repeating unit of the formula —(SiO)$_n$—, a repeating unit of the formula

—(SiR$_1$R$_2$—NR$_3$)$_m$—, and at least one or a combination of repeating units of the formulas

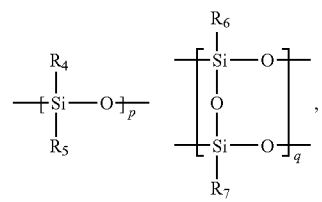

wherein at least one of R$_1$, R$_2$, and R$_3$ is independently hydrogen, R$_1$, R$_2$, and R$_3$ are each independently C$_1$-C$_5$ alkyl, C$_2$-C$_5$ alkenyl, C$_2$-C$_5$ alkynyl, C$_1$-C$_5$ alkoxyl, or C$_6$-C$_{15}$ aryl, R$_4$, R$_5$, R$_6$, and R$_7$ are each independently hydrogen, C$_1$-C$_3$ alkyl, C$_1$-C$_3$ alkoxyl, C$_3$-C$_{10}$ cycloalkyl, or C$_6$-C$_{15}$ aryl, R$_4$ and R$_5$ are not simultaneously hydrogen, R$_6$ and R$_7$ are not simultaneously hydrogen, n+m+r=1, 0<n<1, 0<m<1, and 0<r<1, 'n', 'm', and 'r' are each a molar ratio, 'r' is p, q, or p+q, and a degree of polymerization is about 1,000 to about 1,000,000.

14 Claims, 2 Drawing Sheets

(51) Int. Cl.
*H01L 51/52* (2006.01)
*C09D 183/04* (2006.01)
*C09D 183/16* (2006.01)
*H01L 31/0392* (2006.01)
*H01L 51/00* (2006.01)
*H01L 51/44* (2006.01)
*H01L 21/312* (2006.01)

(52) U.S. Cl.
CPC .......... *H01L31/0392* (2013.01); *H01L 31/048* (2013.01); *H01L 51/0097* (2013.01); *H01L 51/448* (2013.01); *H01L 21/3122* (2013.01); *H01L 21/3125* (2013.01); *Y02E 10/549* (2013.01); *Y10T 428/31663* (2015.04)

(56) References Cited

U.S. PATENT DOCUMENTS

| | | |
|---|---|---|
| 6,316,112 B1 | 11/2001 | DuBois et al. |
| 6,503,634 B1 | 1/2003 | Utz et al. |
| 6,522,067 B1 | 2/2003 | Graff et al. |
| 6,548,912 B1 | 4/2003 | Graff et al. |
| 6,709,757 B2 | 3/2004 | Utz et al. |
| 6,781,148 B2 | 8/2004 | Kubota et al. |
| 7,015,640 B2 | 3/2006 | Schaepkens et al. |
| 7,154,220 B2 | 12/2006 | Schaepkens et al. |
| 7,170,087 B2 | 1/2007 | Kidokoro et al. |
| 2002/0113241 A1* | 8/2002 | Kubota et al. .................. 257/79 |
| 2002/0165319 A1* | 11/2002 | Knasiak et al. ............... 525/100 |
| 2003/0108749 A1 | 6/2003 | Ram |
| 2004/0018364 A1 | 1/2004 | Ota et al. |
| 2004/0175580 A1* | 9/2004 | Schaepkens .................. 428/446 |
| 2005/0017633 A1 | 1/2005 | Miyadera |
| 2006/0093959 A1 | 5/2006 | Huang et al. |
| 2006/0115657 A1* | 6/2006 | Griswold ...................... 428/447 |
| 2006/0256247 A1 | 11/2006 | Hirai et al. |
| 2007/0196966 A1 | 8/2007 | Iwasawa |
| 2007/0252115 A1* | 11/2007 | Arehart et al. ................ 252/583 |
| 2009/0275695 A1* | 11/2009 | Shen et al. .................... 524/588 |

FOREIGN PATENT DOCUMENTS

| | | |
|---|---|---|
| JP | 08-269690 A | 10/1996 |
| JP | 08-281861 A | 10/1996 |
| JP | 2003-118030 A | 4/2003 |
| JP | 2003-327718 A | 11/2003 |
| JP | 2004-529998 A | 9/2004 |
| KR | 1020050093798 A | 9/2005 |
| KR | 1020060117204 A | 11/2006 |
| WO | 02/068535 A1 | 9/2002 |
| WO | 03/016589 A1 | 2/2003 |
| WO | WO 2007044181 A2 * | 4/2007 |

OTHER PUBLICATIONS

European Extended Search Report dated Nov. 25, 2011 for Application No. 09178417.3 citing: US 2004/018364 Al, WO 02/068535 A1, US 2005/017633 A1, JP 2003-118030 A and WO 03/016589 A1.
Bauer et al., "Preparation of moisture curable polysilazane coatings Part I. Elucidation of low temperature curing kinetics by FT-IR spectroscopy", Progress in Organic Coatings, vol. 53, 2005, pp. 183-190.
Prager et al., "Conversion of Perhydropolysilazane into a SiOx Network Triggered by Vacuum Ultraviolet Irradiation: Access to Flexible, Transparent Barrier Coatings", Chem. Eur. J., vol. 13, 2007, pp. 8522-8529.
Japanese Office Action for Japanese Patent Application No. 2009-288286 dated May 20, 2014 with English Translation.

* cited by examiner

GAS BARRIER THIN FILM, ELECTRONIC DEVICE COMPRISING THE SAME, AND METHOD OF PREPARING THE GAS BARRIER THIN FILM

CROSS-REFERENCE TO RELATED APPLICATION

This application claims priority to Korean Patent Application No. 10-2008-0130441, filed on Dec. 19, 2008, and all the benefits accruing therefrom under 35 U.S.C. §119, the content of which in its entirety is herein incorporated by reference.

BACKGROUND

1. Field

One or more exemplary embodiments relate to a gas barrier thin film, an electronic device including the gas barrier thin film, and a method of preparing the gas barrier thin film, and more particularly, to a gas barrier thin film including a silicon-containing organic-inorganic composite copolymer, an electronic device including the gas barrier thin film, and a method of preparing the gas barrier thin film.

2. Description of the Related Art

Organic materials used in electronic devices such as organic light emitting devices ("OLEDs") or liquid crystal display devices ("LCDs") are highly vulnerable to oxygen or moisture in the atmosphere. Thus, when organic materials are exposed to oxygen or moisture, the output and/or the performance of the electronic devices that include the organic materials may decrease.

One method of prolonging the lifetime of electronic devices using a metal layer and a glass layer to protect the electronic devices has been developed. However, metals are not generally transparent, and glass is generally inflexible.

Another method of prolonging the lifetime of electronic devices uses a thin film including silica ($SiO_2$) to protect the electronic devices. The thin film is derived from a polymer such as polysilazane. However, thin films derived from polysilazane are both hard and hydrophilic. In addition, a high temperature equal to or greater than 400° C. (Celsius) is necessary to cure the thin film.

Accordingly, there is a need for a gas barrier thin film or a sealing thin film that is flexible and transparent. It would be a further advantage if the thin film also prevents the penetration of moisture. It would be a still further advantage if the thin films were easily manufactured using a low-temperature curing method. Such thin films would be useful for sealing electronic devices such as flexible OLEDs, and could be used to produce devices that are thin, light, and flexible.

SUMMARY

One or more exemplary embodiments include a gas barrier thin film including a silicon-containing organic-inorganic composite copolymer.

One or more exemplary embodiments include an electronic device including the gas barrier thin film.

One or more exemplary embodiments include a method of preparing the gas barrier thin film.

Additional aspects, advantages and features will be set forth in part in the description which follows and, in part, will be apparent from the description, or may be learned by practice of the exemplary embodiments.

To achieve the above and/or other aspects, advantages and features, one or more exemplary embodiments may include a gas barrier thin film including a substrate; an anchoring layer disposed on a surface of the substrate; and an inorganic oxide layer disposed on a surface of the anchoring layer opposite the substrate, wherein the anchoring layer may include a silicon-containing organic-inorganic composite copolymer including a repeating unit represented by Formula 1 below; a repeating unit represented by Formula 2 below; and at least one repeating unit selected from the group consisting of repeating units represented by Formulas 3 and 4 below, and combinations thereof:

Formula 1

Formula 2

Formula 3

Formula 4 wherein at least one of the group consisting of $R_1$, $R_2$, and $R_3$ may be independently hydrogen, $R_1$, $R_2$, and $R_3$ are each independently a $C_1$-$C_5$ alkyl group, a $C_2$-$C_5$ alkenyl group, a $C_2$-$C_5$ alkynyl group, a $C_1$-$C_5$ alkoxyl group, or a $C_6$-$C_{15}$ aryl group, $R_4$, $R_5$, $R_6$, and $R_7$ are each independently hydrogen, a $C_1$-$C_3$ alkyl group, a $C_1$-$C_3$ alkoxyl group, a $C_3$-$C_{10}$ cycloalkyl group or a $C_6$-$C_{15}$ aryl group, $R_4$ and $R_5$ may not be simultaneously hydrogen, $R_6$ and $R_7$ may not be simultaneously hydrogen, n+m+r=1, 0<n<1, 0<m<1, and 0<r<1, 'n', 'm', and 'r' may each be a molar ratio, 'r' may be p, q, or p+q, and a degree of polymerization may be in the range of about 1,000 to about 1000,000.

To achieve the above and/or other aspects, advantages and features, one or more exemplary embodiments may include a gas barrier thin film including a substrate, a first anchoring layer disposed on the substrate, an inorganic oxide layer disposed on the first anchoring layer, and a second anchoring layer formed on the inorganic oxide layer, wherein the first and second anchoring layers comprise the silicon-containing organic-inorganic composite copolymer.

To achieve the above and/or other aspects, advantages and features, one or more exemplary embodiments may include an electronic device including the gas barrier thin film.

To achieve the above and/or other aspects, advantages and features one or more exemplary embodiments may include a method of preparing a gas barrier thin film, the method including preparing a mixture of a polysilazane and a polysiloxane-based polymer; coating the mixture on a substrate to form a resultant coated substrate, performing a thermosetting process on the resultant coated substrate to form an anchoring layer; and forming an inorganic oxide layer on the anchoring layer using a physical vapor deposition ("PVD") process.

BRIEF DESCRIPTION OF THE DRAWINGS

These and/or other aspects, advantages, and features of exemplary embodiments of the invention will become apparent and more readily appreciated from the following description of the embodiments, taken in conjunction with the accompanying drawings of which.

DETAILED DESCRIPTION

This disclosure will now be described more fully hereinafter with reference to the accompanying drawings, in which embodiments are shown. The exemplary embodiments may, however, be embodied in many different forms and should not be construed as limited to the embodiments set forth herein. Rather, these embodiments are provided so that this disclosure will be thorough and complete, and will fully convey the scope of the claims to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings herein.

The terminology used herein is for the purpose of describing particular embodiments only and is not intended to limit the claims. As used herein, the singular forms "a," "an," and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. The term "disposed on" means that at least a portion or the entirety of the surfaces of two layers are in intimate contact.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments of the present disclosure. As such, variations from the shapes of the illustrations as a result, for example, of manufacturing techniques and/or tolerances, are to be expected. Thus, embodiments of the present disclosure should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, the exemplary embodiments of this disclosure will be described in detail with reference to the accompanying drawings.

All methods described herein can be performed in a suitable order unless otherwise indicated herein or otherwise clearly contradicted by context. The use of any and all examples, or exemplary language (e.g., "such as"), is intended merely for illustration and does not pose a limitation on the scope of the claims unless otherwise claimed. No language in the specification should be construed as indicating that any non-claimed element is essential.

According to an exemplary embodiment, a gas barrier thin film includes a substrate; an anchoring layer disposed on a surface of the substrate; and an inorganic oxide layer disposed on a surface of the anchoring layer opposite the substrate. In one exemplary embodiment the anchoring layer is formed on the surface of the substrate. In another exemplary embodiment, the inorganic oxide layer is formed on the anchoring layer. In still another exemplary embodiment the anchoring layer is formed on the surface of the substrate and the inorganic oxide layer is formed on the anchoring layer. The anchoring layer includes a silicon-containing organic-inorganic composite copolymer including a repeating unit represented by Formula 1 below; a repeating unit represented by Formula 2 below; and at least one repeating unit selected from the group consisting of repeating units represented by Formulas 3 and 4 below and combinations thereof.

$$—(SiO)_n— \qquad\qquad \text{Formula 1}$$

$$—(SiR_1R_2—NR_3)_m— \qquad\qquad \text{Formula 2}$$

Formula 3

Formula 4

In Formulas 1 through 4, at least one of the group consisting of $R_1$, $R_2$, and $R_3$ is independently hydrogen, and $R_1$, $R_2$, and $R_3$ are each independently a $C_1$-$C_5$ alkyl group, a $C_2$-$C_5$ alkenyl group, a $C_2$-$C_5$ alkynyl group, a $C_1$-$C_5$ alkoxyl group, or a $C_6$-$C_{15}$ aryl group, $R_4$, $R_5$, $R_6$, and $R_7$ are each independently hydrogen, a $C_1$-$C_3$ alkyl group, a $C_1$-$C_3$ alkoxyl group, a $C_3$-$C_{10}$ cycloalkyl group or a $C_6$-$C_{15}$ aryl group. In addition, $R_4$ and $R_5$ are not simultaneously hydrogen, $R_6$ and $R_7$ are not simultaneously hydrogen, n+m+r=1, 0<n<1, 0<m<1, and 0<r<1. Furthermore, 'n', 'm', and 'r' are each a molar ratio, 'r' is p, q, or p+q, and the degree of polymerization is in the range of about 1,000 to about 1,000,000. The degree of polymerization may be in the range of about 1,000 to about 200,000.

In one exemplary embodiment, the silicon-containing organic-inorganic composite copolymer included in the anchoring layer may have increased flexibility. Without being bound by theory, it is believed that any increase in flexibility may be attributed to the presence of an alkyl group, an alkoxyl group, or like included in the repeating unit of Formula 3 or 4. In addition, when the repeating unit of Formula 3 and/or 4 is randomly cross-linked with the repeating unit of Formula 1 and/or 2, a hydroxyl group exposed in the anchoring layer is removed, thereby decreasing the hydrophilic properties of the anchoring layer and further preventing the penetration of moisture into the anchoring layer.

Further without being bound by theory, the anchoring layer may function as a stress buffer between the substrate and the inorganic oxide layer so as to prevent cracks from being generated in the inorganic oxide layer, and may increase adhesion between the substrate and the inorganic oxide layer so as to further prevent the penetration of moisture and oxygen. In addition, the anchoring layer may facilitate regular sputtering of the inorganic oxide layer so that the inorganic oxide layer may be accurately formed to a predetermined thickness or more. Still further without being bound by theory, it is believed that the inorganic oxide layer may prevent the penetration of oxygen, moisture, and harmful substances from the environment.

Figure 1:
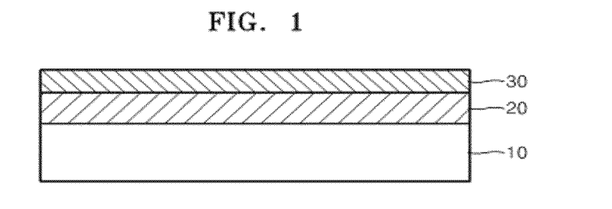
FIG. 1 is a schematic, cross-sectional view of an exemplary embodiment of a gas barrier thin film.

FIG. 1 is a schematic cross-sectional view of an exemplary embodiment of a gas barrier thin film. Referring to FIG. 1, the gas barrier thin film includes a substrate 10; an anchoring layer 20 disposed on, e.g., formed on a surface of the substrate 10 that includes a silicon-containing organic-inorganic composite copolymer; and an inorganic oxide layer 30 disposed on, e.g., formed on a surface the anchoring layer 20 opposite the substrate 10.

In exemplary embodiments the gas barrier thin film may have excellent light transmittance equal to or greater than about 70% in a visible light wavelength region. For example, the light transmittance may be in the range of about 70 to about 90% at a wavelength equal to or greater than about 400 nm, and light transmittance may be in the range of about 80 to about 90% at a wavelength equal to or greater than about 500 nm. The light transmittance may be adjusted so as to be suitable for achieving the intended purpose of the gas barrier film.

In exemplary embodiments, the silicon-containing organic-inorganic composite copolymer may be prepared by coating a mixture of a polysilazane and a polysiloxane-based polymer on a substrate, to provide a resultant coated substrate. A thermosetting process, for example a condensation process is then performed on the coated mixture to crosslink the polysilazane and the polysiloxane-based polymer. In the mixture of the polysilazane and the polysiloxane-based polymer, water is generated as a by-product of condensation reactions occurring between the —Si—H bonds of the polysilazane and a terminal OH-group of the polysiloxane-based polymer. Hydrolysis of the polysilazane and condensation of the end groups of the polysiloxane then rapidly occur using the water as a catalyst, thereby completing the preparation of the silicon-containing organic-inorganic composite copolymer.

In one exemplary embodiment, the thermosetting process may be performed in a range suitable for thermosetting the mixture, for example at a temperature equal to or less than about 150° C., or for example, at a temperature in the range of about 60 to about 120° C.

In the gas barrier thin film according to an exemplary embodiment, the polysilazane may include a repeating unit represented by Formula 5 below.

Formula 5

In Formula 5, at least one of the group consisting of $R_1$, $R_2$, and $R_3$ is independently hydrogen, $R_1$, $R_2$, and $R_3$ are each independently a $C_1$-$C_5$ alkyl group, a $C_2$-$C_5$ alkenyl group, a $C_2$-$C_5$ alkynyl group, a $C_1$-$C_5$ alkoxyl group, or a $C_6$-$C_{15}$ aryl group, and 'a' is an integer in the range of about 100 to about 1,000,000.

In exemplary embodiments, the polysilazane may include repeating units represented by Formulas 8 through 10 below.

Formula 8

Formula 9

Formula 10

In Formulas 8, 9 and 10, 'd' is an integer in the range of about 500 to about 1,000,000, and 'e' and 'f' are each independently an integer in the range of about 250 to about 500,000.

In addition, in other exemplary embodiments the polysiloxane-based polymer may include at least one repeating unit selected from the group consisting of repeating units represented by Formulas 6 and 7 below, and combinations thereof. The polysiloxane-based polymer may further include a hydroxyl group as an end group. For example, the polysiloxane-based polymer may include about 5 mole percent (mol %) or more of a hydroxyl group as an end group of the polysiloxane-based polymer.

Formula 6

Formula 7

In Formulas 6 and 7, $R_4$, $R_5$, $R_6$, and $R_7$ are each independently hydrogen, a $C_1$-$C_3$ alkyl group, a $C_1$-$C_3$ alkoxyl group, a $C_3$-$C_{10}$ cycloalkyl group or a $C_6$-$C_{15}$ aryl group, $R_4$ and $R_5$ are not simultaneously hydrogen, $R_6$ and $R_7$ are not simultaneously hydrogen, and 'b' and 'c' are each independently an integer in the range of about 200 to about 200,000.

According to another embodiment, the gas barrier thin film may further include at least one layer selected from the group consisting of an anchoring layer, an inorganic oxide layer and combinations thereof, which are alternately stacked on a surface of the substrate opposite to that on which the anchoring layer 20 and the inorganic oxide layer 30 are formed in FIG. 1 (not shown). Alternatively, or in addition, in still another embodiment, the gas barrier thin film may further include at least one layer selected from the group consisting of an anchoring layer, an inorganic oxide layer and combinations thereof, which are alternately stacked on an inorganic oxide layer corresponding to the inorganic oxide layer 30 of FIG. 1.

Figure 2:
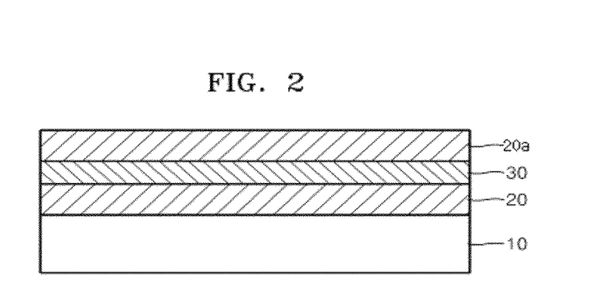
FIG. 2 is a schematic, cross-sectional view of an exemplary embodiment of a gas barrier thin film.
Figure 3:
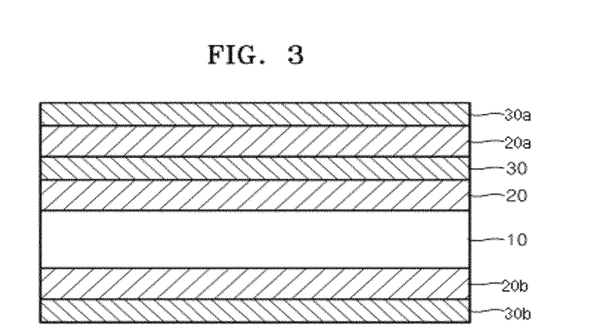
FIG. 3 is a schematic, cross-sectional view of another exemplary embodiment of a gas barrier thin film.

FIGS. 2 and 3 are cross-sectional views illustrating one or more combinations of gas barrier thin films according to these other embodiments. Referring to FIG. 2, the gas barrier thin film according to an exemplary embodiment includes a substrate 10; a first anchoring layer 20 including a silicon-containing organic-inorganic composite copolymer and disposed, e.g., formed on the substrate 10; an inorganic oxide layer 30 disposed, e.g., formed on a surface of the first anchoring layer 20; and a second anchoring layer 20a including a silicon-containing organic-inorganic composite copolymer disposed, e.g., formed on a surface of the inorganic oxide layer 30.

Referring to FIG. 3, the gas barrier thin film according to another exemplary embodiment includes a substrate 10 having a first surface and an opposite second surface; a first anchoring layer 20 including a silicon-containing organic-inorganic composite copolymer and disposed, e.g., formed on the first surface of the substrate 10; a first inorganic oxide layer 30 disposed, e.g., formed on a surface of the first anchoring layer 20 opposite the substrate layer 10; a second anchoring layer 20a disposed, e.g., formed on a surface of the first inorganic oxide layer 30 opposite the first anchoring layer 20; a second inorganic oxide layer 30a disposed, e.g., formed on a surface of the second anchoring layer 20a opposite the first inorganic oxide layer 30; a third anchoring layer 20b disposed, e.g., formed on the second surface of the substrate 10; and a third inorganic oxide layer 30b disposed, e.g., formed on the third anchoring layer 20.

By virtue of the above-described layers that are alternately stacked, the gas barrier thin films according to the exemplary embodiments illustrated in FIGS. 2 and 3 may further prevent the penetration of moisture, oxygen, and harmful substances.

In addition, the gas barrier thin film may further optionally include a protecting layer disposed on a surface of the inorganic oxide layer(s) on a side opposite an anchoring layer. The protecting layer prevents damage to the surfaces of the inorganic oxide layers. The protecting layer may include at least one compound selected from the group consisting of fluorine, silicon, a lipophilic polymer, and any mixtures thereof, but is not limited thereto.

In the gas barrier thin films according to the above exemplary embodiments, the substrate 10 may be formed of a plastic or a metal, and the plastic or the metal may be flexible. The substrate 10 may be a general substrate used in electronic devices or packing materials. Examples of materials used to form the substrate 10 may include polyoxymethylene, polyvinyinaphthalene, polyetheretherketone, a fluoropolymer, poly-α-methyl styrene, polysulfone, polyphenylene oxide, polyetherimide, polyethersulfone, polyamideimide, polyimide, polyphthalamide, polycarbonate, polyarylate, polyethylenenaphthalate, and polyethyleneterephthalate.

An electronic device according to an exemplary embodiment includes the gas barrier thin films described herein, for example any one or more of the gas barrier films of FIG. 1, 2, or 3. Because the gas barrier thin films may be highly effective to prevent the penetration of oxygen and moisture, and further have a high tolerance with respect to diffusion of compounds, the gas barrier thin films may prolong the lifetime of the electronic device when the gas barrier thin film is used as a sealing thin film for the electronic device.

In exemplary embodiments, the electronic device may be, for example, an organic light emitting device ("OLED"), a display device, a photovoltaic device, an integrated circuit, a pressure sensor, a chemical sensor, a bio sensor, or a lighting device, but it is not limited thereto.

A method of preparing a gas barrier thin film, according to an exemplary embodiment, includes preparing a mixture of a polysilazane and a polysiloxane-based polymer; coating the mixture on a substrate to form a resultant coated substrate; and then performing a thermosetting process with respect to the mixture of polysilazane and polysiloxane-based polymer of the resultant coated substrate to form an anchoring layer; and forming an inorganic oxide layer on the anchoring layer. In one embodiment, the inorganic oxide layer is formed using a physical vapor deposition ("PVD") process.

In exemplary embodiments the mixture is prepared by mixing the polysilazane and the polysiloxane-based polymer using an organic solvent and then storing the polysilazane and the polysiloxane-based polymer mixture for a predetermined period of time. The predetermined period of time is determined according to the specific polysilazane, the polysiloxane-based polymer used, and other considerations such as temperature, and may be in the range of about 10 seconds to about 10 minutes. The anchoring layer having a predetermined thickness is formed by coating the mixture on the substrate and then performing the thermosetting process to crosslink and further react polysilazane and the polysiloxane-based polymer.

In exemplary embodiments the thermosetting process may include curing by heating the mixture on a hot plate for about 1 to about 10 minutes at a temperature in the range of about 50 to about 150° C., followed by heating the mixture in a vacuum oven for about 1 minute to about 3 hours at a temperature in the range of about 50 to about 150° C., and may optionally further include performing the thermosetting process with respect to the mixture in a temperature- and humidity-controlled oven for about 1 to about 3 hours at a temperature in the range of about 50 to about 150° C. and at a relative humidity in the range of about 50 to about 100%. Alternatively, the thermosetting process may include curing the mixture on a hot plate for about 1 to about 10 minutes at a temperature in the range of about 50 to about 150° C., followed by heating the mixture in a temperature- and humidity-controlled oven for about 1 to about 3 hours at a temperature in the range of about 50 to about 150° C. and at a relative humidity in the range of about 50 to about 100%. An inorganic oxide layer is then formed on the anchoring layer, for example by using a PVD process.

Using this method of preparing the gas barrier thin film, a silicon-containing organic-inorganic composite copolymer may be simply and rapidly prepared. In addition, preparation of the silicon-containing organic-inorganic composite copolymer is facile and lower cost because a curing condition at a temperature greater than 200° C. is not used. Also, the properties of the silicon-containing organic-inorganic composite copolymer included in the anchoring layer may be varied according to the preparation conditions. For example, a mixing ratio of the polysilazane and the polysiloxane-based polymer, the amount of a substitute group (e.g., an alkyl group, etc.) contained in the silicon-containing organic-inorganic composite copolymer, and the period of time for storing the mixture can be varied to produce composite copolymers having different properties.

According to an exemplary embodiment, in the method of preparing the gas barrier thin film, the polysilazane may include a repeating unit represented by Formula 5 below.

$$-(SiR_1R_2-NR_3)_a-$$ Formula 5

In Formula 5, at least one of the group consisting of $R_1$, $R_2$, and $R_3$ is hydrogen, $R_1$, $R_2$, and $R_3$ are each independently a $C_1$-$C_5$ alkyl group, a $C_2$-$C_5$ alkenyl group, a $C_2$-$C_5$ alkynyl group, a $C_1$-$C_5$ alkoxyl group, or a $C_6$-$C_{15}$ aryl group, and 'a' is an integer in the range of about 100 to about 1,000,000.

Further, the polysilazane may include at least one repeating unit represented by Formulas 8 through 10 below.

Formula 8

Formula 9

Formula 10

In Formulas 8, 9, and 10, 'd' is an integer in the range of about 500 to about 1,000,000, and 'e' and 'f' are each independently an integer in the range of about 250 to about 500,000.

In addition, the polysiloxane-based polymer may include at least one repeating unit selected from the group consisting of repeating units represented by Formulas 6 and 7, and combinations thereof, and may include a hydroxyl group as a terminal group. For example, the polysiloxane-based polymer may include about 5 mol % or more of the hydroxyl group as a terminal group.

Formula 6

Formula 7

In Formulas 6 and 7, $R_4$, $R_5$, $R_6$, and $R_7$ are each independently hydrogen, a $C_1$-$C_3$ alkyl group, a $C_1$-$C_3$ alkoxyl group, a $C_3$-$C_{10}$ cycloalkyl group, or a $C_6$-$C_{15}$ aryl group, $R_4$ and $R_5$ are not simultaneously hydrogen, $R_6$ and $R_7$ are not simultaneously hydrogen, and 'b' and 'c' are each independently an integer in the range of about 200 to about 200,000.

The organic solvent used to prepare the mixture of the polysilazane and the polysiloxane-based polymer is not particularly limited. Examples of the organic solvent may include aromatic hydrocarbons such as anisole, and xylene, a ketone solvent such as methyl isobutyl ketone, and acetone, an ether solvent such as tetrahydrofuran, isopropyl ether, and dibutyl ether, a silicon solvent, and any mixture including at least one of the foregoing. In a polysilazane mixture and/or polysiloxane-based polymer mixture including the solvent, the concentration of solids of the polysilazane and the polysiloxane-based polymer may be in the range of about 0.1 to about 80 weight percent (wt %), for example, in the range of about 5 to about 30 wt %.

In the method of preparing the gas barrier thin, a mixing weight ratio of the polysilazane and the polysiloxane-based polymer of the mixture is selected so as to provide the desired composite composition and properties, and may be in a range of about 9:1 to about 1:2, respectively.

In the method of preparing the gas barrier thin film according to the exemplary embodiments, the mixture may be coated on the substrate by bar coating, drop casting, spin coating, dip coating, spray coating, flow coating, or screen printing methods, but the coating method is not limited thereto.

In exemplary embodiments of the method of preparing the gas barrier thin film, the thermosetting process may be performed at a temperature effective to result in thermosetting of the reactants, preferably avoiding higher temperatures in order to achieve the advantages described herein. For example, the temperature can be equal to or less than 150° C., for example, in the range of about 60 to about 120° C.

In exemplary embodiments the inorganic oxide layer may then be deposited on the anchoring layer, for example by using PVD deposition process equipment. Examples of a PVD process used to deposit the inorganic oxide layer on the anchoring layer may include a sputtering process, a pulsed laser deposition ("PLD") process, a ion beam deposition ("IBD") process, and an ion beam assisted deposition ("IBAD") process, but the PVD process is not limited thereto.

In exemplary embodiments of the gas barrier thin films, the method of preparing the gas barrier thin film, and the devices containing the gas barrier thin films, the inorganic oxide layer may include $SiO_2$, $Al_2O_3$, MgO, ZnO, or any mixture of at least one of the foregoing.

The method of preparing the gas barrier thin film may further optionally include forming a protecting layer on the inorganic oxide layer. The protecting layer may be formed by dissolving a material including at least one compound selected from the group consisting of fluorine, silicon, a lipophilic polymer, and any mixtures thereof in a solvent, coating the resultant on the inorganic oxide layer, and then performing the thermosetting process with respect to the resultant coating. The thermosetting process is performed on the resultant coating for about 30 minutes to about 3 hours at a temperature in the range of about 50 to about 100° C.

Hereinafter, the exemplary embodiments will be described in more detail with reference to the following examples. However, the following examples are only for illustrative purposes and are not intended to limit the scope of the presented exemplary embodiments.

Preparation of Gas Barrier Thin Film

EXAMPLE 1

A mixture was prepared by mixing 3 milliliters (ml) of a solution (AZ Electronic Materials, Lot No. 07101676A, amount of solids 21 wt %) in which perhydropolysilazane was dissolved in dibutylether and 0.5 ml of polydimethylsiloxane (Aldrich, molecular weight 550, Lot No. 481939) represented by Formula 11 below, and storing the mixture for 30 seconds. Then, the mixture was coated on a polyethylene naphthalate ("PEN") substrate (DuPont Teijin Films, and having a thickness of 100 micrometers (μm)) by using a spin-coating method. In this regard, the mixture was coated on the PEN substrate at a coating rate of 1200 rpm for 40 seconds. Then, the PEN substrate on which the mixture was coated was cured in a hot plate for 3 minutes at a temperature of 85° C., followed by curing in a vacuum oven for about 2 hours at a temperature 80° C., thereby forming an anchoring layer having a thickness of 700 nm. Then, an aluminum-based (e.g., aluminum oxide, ($Al_2O_3$)) thin film was formed on the anchoring layer to a thickness of 150 nm by using a deposition apparatus (such as ULVAC Materials, PME-200), thereby completing the manufacture of a gas barrier thin film.

Formula 11

EXAMPLE 2

A gas barrier thin film was prepared in the same manner as in Example 1 except that an anchoring layer having a thickness of 750 nm was formed by curing the PEN substrate on which the mixture was coated on a hot plate for 3 minutes at a temperature of 85° C., and then curing in an oven for 2 hours at a temperature of 85° C. and at a relative humidity of 85%.

EXAMPLE 3

A gas barrier thin film was prepared in the same manner as in Example 1 except that an anchoring layer having a thickness of 700 nm was formed by curing the PEN substrate on which the mixture was coated on a hot plate for 3 minutes at a temperature of 85° C., followed by curing in a vacuum oven for 1 hour at a temperature of 80° C., and then curing in an oven for 2 hours at a temperature of 85° C. and at a relative humidity of 85%.

EXAMPLE 4

A gas barrier thin film was prepared by forming an anchoring layer and an inorganic oxide layer on a plastic PEN substrate (DuPont Teijin Films, and having a thickness of 100 um) in the same manner as in Example 3, and then forming another anchoring layer on the inorganic oxide layer.

EXAMPLE 5

A gas barrier thin film was prepared by forming a first anchoring layer, a first inorganic oxide layer, and a second anchoring layer on a surface of a plastic PEN substrate (DuPont Teijin Films, and having a thickness of 100 um) in the same manner as in Example 3. Then, sequentially forming a third anchoring layer, a second inorganic oxide layer, a fourth anchoring layer, and a third inorganic oxide layer on a surface of the plastic PEN substrate opposite to that on which the first anchoring layer, the first inorganic oxide layer and the second anchoring layer were previously formed.

COMPARATIVE EXAMPLE 1

A gas barrier thin film was prepared by preparing a polyethyleneterephthalate ("PET") substrate (thickness 200 um), depositing polyurea ("PU") to a thickness of 1 um by using a PVD deposition apparatus (ULVAC Materials, PME-200), using only a deposition chamber in the PVD deposition apparatus, and then forming an alumina inorganic oxide layer to a thickness of 50 nm on the PET substrate.

COMPARATIVE EXAMPLE 2

A gas barrier thin film was prepared in the same manner as in Comparative Example 1 except that a PU layer having a thickness of 1 um, an $Al_2O_3$ layer having a thickness of 50 nm, a PU layer having a thickness of 1 um, and an $Al_2O_3$ layer having a thickness of 50 nm were sequentially deposited in that order on the PET substrate.

COMPARATIVE EXAMPLE 3

A gas barrier thin film was prepared in the same manner as in Comparative Example 1 except that a PU layer having a thickness of 1 um, an $Al_2O_3$ layer having a thickness of 50 nm, a PU layer having a thickness of 1 um, an $Al_2O_3$ layer having a thickness of 50 nm, a PU layer having a thickness of 1 um, and a $Al_2O_3$ layer having a thickness of 50 nm were sequentially deposited in that order on the PET substrate.

COMPARATIVE EXAMPLE 4

A PEN substrate (Dupont Teijin Films Japan Limited, and Product name: TEONEX, Q65FA-100 um) was used.

MEASUREMENT EXAMPLE 1

Water Vapor Transmission Rate ("WVTR")

A WVTR of each of the gas barrier thin films prepared in Examples 4 and 5, and in Comparative Examples 1 through 3 was measured using an AQUATRAN Model 1 (manufactured by MOCON) system at a temperature of 37.8° C., and at 100% relative humidity ("RH"). The results are shown in Table 1 below.

TABLE 1

| | WVTR [grams per square meter per day, (g/m² · day)] |
|---|---|
| Example 4 | 0.058 |
| Example 5 | less than 0.0005 |
| Comparative Example 1 | 6.5 |
| Comparative Example 2 | 0.16 |
| Comparative Example 3 | 0.07 |

As shown in Table 1, the gas barrier thin films prepared in Examples 4 and 5 exhibit lower WVTRs than the WVTRs in Comparative Examples 1 through 3.

MEASUREMENT EXAMPLE 2

Visible Light Transmittance

Figure 4:
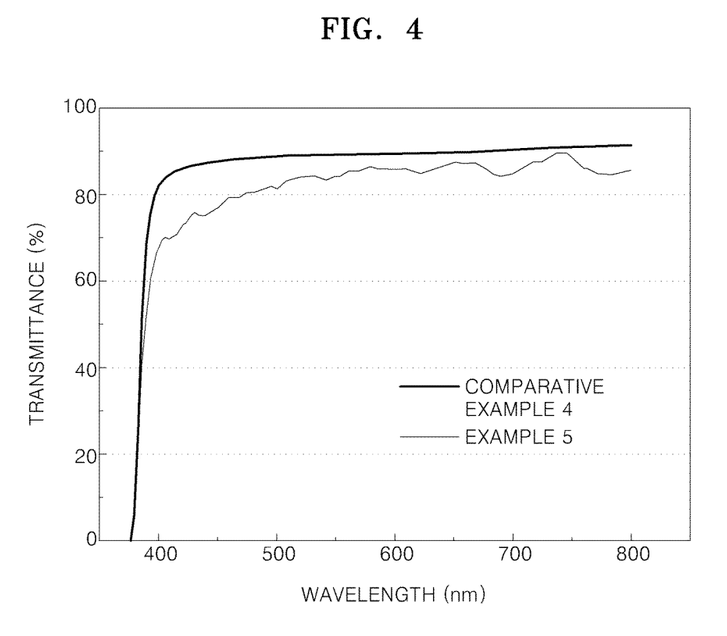
FIG. 4 is a graph of light transmittance (percent) versus wavelength (nanometers, "nm") of exemplary embodiments of gas barrier thin films prepared in accordance with Example 6 and Comparative Example 4.

The visible light transmittance for each of the gas barrier thin films prepared in Example 5 and Comparative Example 4 was measured using a CARY 5000 UV-VIS Spectrophotometer (manufactured by VARIAN). The results are shown in FIG. 4. Referring to FIG. 4, the gas barrier thin film prepared in Example 5 exhibits a visible light transmittance in the range of about 80 to about 90% at a visible light wavelength equal to or greater than 500 nm. The visible light transmittance of the gas barrier thin film is similar to the visible light transmittance of the PEN substrate.

As described above, according to one or more of the above exemplary embodiments, a gas barrier thin film including a new silicon-containing organic-inorganic composite copolymer may prevent the penetration of oxygen and moisture and may be easily prepared.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A gas barrier film comprising:
   a substrate;
   an anchoring layer disposed on a surface of the substrate; and
   an inorganic oxide layer disposed directly on a surface of the anchoring layer opposite the substrate, wherein the inorganic oxide layer comprises $Al_2O_3$, $MgO$, $ZnO$, or a mixture thereof;
   wherein the anchoring layer comprises a coating of a silicon-containing organic-inorganic composite copolymer as a thermoset of a mixture of a polysilazane and a polysiloxane-based polymer,
   wherein the copolymer comprises a repeating unit represented by Formula 1 below; a repeating unit represented by Formula 2 below; and at least one repeating unit selected from the group consisting of repeating units represented by Formulas 3 and 4 below, and a combination thereof:

$-(SiO)_n-$  Formula 1

$-(SiR_1R_2-NR_3)_m-$  Formula 2

$$\begin{array}{c} R_4 \\ | \\ -[Si-O]_p- \\ | \\ R_5 \end{array}$$  Formula 3

$$\begin{array}{c} R_6 \\ | \\ -[Si-O]- \\ | \\ O \\ | \\ -[Si-O]_q- \\ | \\ R_7 \end{array},$$  Formula 4 wherein at least one of the group consisting of $R_1$, $R_2$, and $R_3$ is independently hydrogen, and the remaining $R_1$, $R_2$, and $R_3$ are each independently a $C_1$-$C_5$ alkyl group, a $C_2$-$C_5$ alkenyl group, a $C_2$-$C_5$ alkynyl group, a $C_1$-$C_5$ alkoxyl group, or a $C_6$-$C_{15}$ aryl group,
   $R_4$, $R_5$, $R_6$, and $R_7$ are each independently hydrogen, a $C_1$-$C_3$ alkyl group, a $C_1$-$C_3$ alkoxyl group, a $C_3$-$C_{10}$ cycloalkyl group or a $C_6$-$C_{15}$ aryl group,
   $R_4$ and $R_5$ are not simultaneously hydrogen,
   $R_6$ and $R_7$ are not simultaneously hydrogen,
   n+m+r=1, 0<n<1, 0<m<1, and 0<r<1,
   'n', 'm', 'p', 'q', and 'r' are each a mole fraction of respective repeating units,
   'r' is p, q, or p+q, and
   a degree of polymerization is in the range of about 1,000 to about 1,000,000,
   wherein the at least one repeating unit selected from the group consisting of repeating units represented by Formulas 3, 4, and a combination thereof of the silicon-containing organic-inorganic composite copolymer is randomly cross-linked with the repeating unit represented by Formula 2 of the silicon-containing organic-inorganic composite copolymer, wherein the crosslink results from removal of a hydroxyl group at an end group of the polysiloxane-based polymer,
   wherein a mixing weight ratio of the polysilazane and the polysiloxane-based polymer of the mixture is in a range of about 9:1 to about 1:2, and
   wherein a light transmittance of the gas barrier film is equal to or greater than about 70% in a visible light wavelength region.

2. The gas barrier film of claim 1, wherein a visible light transmittance of the gas barrier thin film is about 70% or more.

3. The gas barrier film of claim 1, further comprising a protecting layer disposed on the inorganic oxide layer.

4. The gas barrier film of claim 1, wherein the silicon-containing organic-inorganic composite copolymer thermoset is from exposure of the mixture of a polysilazane and a polysiloxane-based polymer at a temperature equal to or less than about 150° C.

5. The gas barrier film of claim 1, wherein the polysilazane comprises a repeating unit represented by Formula 5 below:

$-(SiR_1R_2-NR_3)_a-$  Formula 5, wherein at least one of the group consisting of $R_1$, $R_2$, and $R_3$ is independently hydrogen, $R_1$, $R_2$, and $R_3$ are each independently a $C_1$-$C_5$ alkyl group, a $C_2$-$C_5$ alkenyl group, a $C_2$-$C_5$ alkynyl group, a $C_1$-$C_5$ alkoxyl group, or a $C_6$-$C_{15}$ aryl group, and
   'a' is an integer in the range of about 100 to about 1,000,000.

6. The gas barrier film of claim 1, wherein the polysilazane comprises at least one repeating unit represented by Formulas 8, 9, and 10 below:

Formula 8

Formula 9

Formula 10 wherein 'd' is an integer in the range of about 500 to about 1,000,000, and 'e' and 'f' are each independently an integer in the range of about 250 to about 500,000.

7. The gas barrier film of claim 1, wherein the polysiloxane-based polymer comprises at least one repeating unit selected from the group consisting of repeating units represented by Formulas 6 and 7 below, and a combination thereof, and wherein the polysiloxane-based polymer further comprises about 5 mol % or more of a hydroxyl group as an end group of the polysiloxane-based polymer:

Formula 6

Formula 7 wherein $R_4$, $R_5$, $R_6$, and $R_7$ are each independently hydrogen, a $C_1$-$C_3$ alkyl group, a $C_1$-$C_3$ alkoxyl group, a $C_3$-$C_{10}$ cycloalkyl group, or a $C_6$-$C_{15}$ aryl group, $R_4$, and $R_5$ are not simultaneously hydrogen, $R_6$, and $R_7$ are not simultaneously hydrogen, and 'b' and 'c' are each independently an integer in the range of about 200 to about 200,000.

8. The gas barrier film of claim 1, further comprising at least one layer selected from the group consisting of a second anchoring layer, a second inorganic oxide layer, and any combination thereof, wherein the layers are alternately stacked on another surface of the substrate.

9. The gas barrier film of claim 1, further comprising at least one layer selected from the group consisting of a second anchoring layer, a second inorganic oxide layer, and any combination thereof, wherein the layers are alternately stacked on the inorganic oxide layer.

10. The gas barrier film of claim 1, wherein the substrate comprises a plastic or a metal.

11. The gas barrier film of claim 10, wherein the plastic and the metal are flexible.

12. An electronic device comprising a gas barrier film, wherein the gas barrier thin film comprises:
a substrate;
an anchoring layer disposed on a surface of the substrate; and
an inorganic oxide layer disposed directly on the anchoring layer, wherein the inorganic oxide layer comprises $Al_2O_3$, MgO, ZnO, or a mixture thereof;
wherein the anchoring layer comprises a coating of a silicon-containing organic-inorganic composite copolymer as a thermoset of a mixture of a polysilazane and a polysiloxane-based polymer,
wherein the copolymer comprises a repeating unit represented by Formula 1 below; a repeating unit represented by Formula 2 below; and at least one repeating unit selected from the group consisting of the repeating units represented by Formulas 3 and 4 below, and a combination thereof:

—(SiO)$_n$—      Formula 1

—(SiR$_1$R$_2$—NR$_3$)$_m$—      Formula 2

Formula 3

Formula 4 wherein at least one of the group consisting of $R_1$, $R_2$, and $R_3$ is independently hydrogen, and the remaining $R_1$, $R_2$, and $R_3$ are each independently a $C_1$-$C_5$ alkyl group, a $C_2$-$C_5$ alkenyl group, a $C_2$-$C_5$ alkynyl group, a $C_1$-$C_5$ alkoxyl group, or a $C_6$-$C_{15}$ aryl group, $R_4$, $R_5$, $R_6$, and $R_7$ are each independently hydrogen, a $C_1$-$C_3$ alkyl group, a $C_1$-$C_3$ alkoxyl group, a $C_3$-$C_{10}$ cycloalkyl group, or a $C_6$-$C_{15}$ aryl group, $R_4$ and $R_5$ are not simultaneously hydrogen, $R_6$ and $R_7$ are not simultaneously hydrogen, n+m+r=1, 0<n<1, 0<m<1, and 0<r<1, 'n', 'm', 'p', 'q' and 'r' are each a mole fraction of respective repeating units of the silicon-containing organic-inorganic composite copolymer, 'r' is p, q, or p+q, and a degree of polymerization is in the range of about 1,000 to about 1,000,000, wherein the at least one repeating unit selected from the group consisting of repeating units represented by Formulas 3, 4, and a combination thereof of the silicon-containing organic-inorganic composite copolymer is randomly cross-linked with the repeating unit represented by Formula 2 of the silicon-containing organic-inorganic composite copolymer, wherein the crosslink results from removal of a hydroxyl group at an end group of the polysiloxane-based polymer, wherein a mixing weight ratio of the polysilazane and the polysiloxane-based polymer of the mixture is in a range of about 9:1 to about 1:2, and wherein a light transmittance of the gas barrier film is equal to or greater than about 70% in a visible light wavelength region.

13. The electronic device of claim 12, wherein the electronic device is an organic light emitting device, a display device, a photovoltaic device, an integrated circuit, a pressure sensor, a chemical sensor, a biosensor, or a lighting device.

14. A gas barrier film comprising:
a substrate;
a first anchoring layer disposed on a surface of the substrate;
an inorganic oxide layer disposed directly on a surface of the first anchoring layer, wherein the inorganic oxide layer comprises $Al_2O_3$, MgO, ZnO, or a mixture thereof; and a second anchoring layer formed on a surface of the inorganic oxide layer opposite the first anchoring layer,
wherein each of the first and second anchoring layers comprises a coating of a silicon-containing organic-inorganic composite copolymer as a thermoset of a mixture of a polysilazane and a polysiloxane-based polymer,
wherein the copolymer comprises a repeating unit represented by Formula 1 below; a repeating unit represented by Formula 2 below; and at least one repeating unit selected from the group consisting of the repeating units represented by Formulas 3 and 4 below, and a combination thereof:

$$—(SiO)_n—  \qquad \text{Formula 1}$$

$$—(SiR_1R_2—NR_3)_m—  \qquad \text{Formula 2}$$

Formula 3

Formula 4 wherein at least one of the group consisting of $R_1$, $R_2$, and $R_3$ is independently hydrogen, and the remaining $R_1$, $R_2$, and $R_3$ are each independently a $C_1$-$C_5$ alkyl group, a $C_2$-$C_5$ alkenyl group, a $C_2$-$C_5$ alkynyl group, a $C_1$-$C_5$ alkoxyl group, or a $C_6$-$C_{15}$ aryl group, $R_4$, $R_5$, $R_6$, and $R_7$ are each independently hydrogen, a $C_1$-$C_3$ alkyl group, a $C_1$-$C_3$ alkoxyl group, a $C_3$-$C_{10}$ cycloalkyl group, or a $C_6$-$C_{15}$ aryl group, $R_4$ and $R_5$ are not simultaneously hydrogen,
$R_6$ and $R_7$ are not simultaneously hydrogen,
n+m+r=1, 0<n<1, 0<m<1, and 0<r<1,
'n', 'm', 'p', 'q' and 'r' are each a mole fraction of respective repeating units,
'r' is p, q, or p+q, and
a degree of polymerization is in the range of about 1,000 to about 1,000,000, wherein the at least one repeating unit selected from the group consisting of repeating units represented by Formulas 3, 4, and a combination thereof of the silicon-containing organic-inorganic composite copolymer is randomly cross-linked with the repeating unit represented by Formula 2 of the silicon-containing organic-inorganic composite copolymer, wherein the crosslink results from removal of a hydroxyl group at an end group of the polysiloxane-based polymer, wherein a mixing weight ratio of the polysilazane and the polysiloxane-based polymer of the mixture is in a range of about 9:1 to about 1:2, and wherein a light transmittance of the gas barrier film is equal to or greater than about 70% in a visible light wavelength region.

* * * * *